United States Patent [19]
Tseng

[11] Patent Number: 5,643,819
[45] Date of Patent: Jul. 1, 1997

[54] METHOD OF FABRICATING FORK-SHAPED STACKED CAPACITORS FOR DRAM CELLS

[75] Inventor: Horng-Huei Tseng, Hsinchu, Taiwan

[73] Assignee: Vanguard International Semiconductor Corporation, Hsin-Chu, Taiwan

[21] Appl. No.: 549,864

[22] Filed: Oct. 30, 1995

[51] Int. Cl.$^6$ .................................................. H01L 21/8242
[52] U.S. Cl. ........................ 437/60; 437/191; 437/919
[58] Field of Search ................................. 437/47, 60, 191, 437/193, 195, 919

[56]  References Cited

U.S. PATENT DOCUMENTS

| | | | |
|---|---|---|---|
| 5,332,685 | 7/1994 | Park et al. | 437/52 |
| 5,364,813 | 11/1994 | Koh | 437/60 |
| 5,386,382 | 1/1995 | Ahn | 365/174 |
| 5,399,518 | 3/1995 | Sim et al. | 437/52 |
| 5,491,103 | 2/1996 | Ahn et al. | 437/60 |
| 5,519,719 | 5/1996 | Ryou | 437/919 |

*Primary Examiner*—Chandra Chaudhari
*Attorney, Agent, or Firm*—George O. Saile

[57] ABSTRACT

A method for manufacturing an array of fork-shaped stacked capacitors with increased capacitance on a dynamic random access memory (DRAM) device, was achieved. The invention utilizes a single masking step and self-aligning etch back steps to form a very high density array of bottom capacitor (node) electrodes for a DRAM device. The method involves depositing and planarizing a thick insulating over the DRAM cell areas, and then etching node contact openings with vertical sidewalls to the node contact areas of the FETs. Polysilicon plugs are formed in the node contact openings, and then the thick insulating layer is etched back to expose the upper portion of the plugs. Another polysilicon layer is deposited and then silicon nitride sidewall spacers followed by polysilicon sidewall spacers are formed by etch back to provide fork-shaped bottom electrodes. After removing the silicon nitride spacers, a capacitor interelectrode dielectric is formed on the bottom electrodes and another polysilicon layer is patterned to form the top electrodes and complete the array of fork-shaped storage capacitors on the DRAM device.

35 Claims, 16 Drawing Sheets

METHOD OF FABRICATING FORK-SHAPED STACKED CAPACITORS FOR DRAM CELLS

BACKGROUND OF THE INVENTION

(1) FIELD OF THE INVENTION

This invention relates to an integrated circuit semiconductor device, and more particularly, to a method for fabricating dynamic random access memory (DRAM) having DRAM cells with fork-shaped stacked capacitors for increased capacitance.

(2) DESCRIPTION OF THE PRIOR ART

In recent years there has been a dramatic increase in the integrated circuit density on the semiconductor substrate and the semiconductor chips formed therefrom. This increase in density has resulted from the down sizing of the individual devices and the resulting increase in device packing density. The reduction in device size was achieved predominantly by recent advances in high resolution photolithography, directional (anisotropic) plasma etching and other semiconductor technology innovations. However, future requirements for even greater circuit density is putting additional demand on the semiconductor processing technologies and also on the device electrical requirements.

The DRAM chip used in the electronics industry for storing information is one of the circuit types experiencing this demand for increased density. The circuit on the DRAM chip consists in part of an array of individual DRAM storage cells that store binary data (bits) as electrical charge on a storage capacitor. This information is stored or retrieved from the storage capacitor by means of a pass transistor on each memory cell, and by address and read/write circuits on the periphery of the DRAM chip. The pass transistor is usually a field-effect-transistor (FET) and the single capacitor in each cell is either formed in the semiconductor substrate as a trench capacitor or built over the FET in the cell area as a stacked capacitor. By the year 1998 the number of memory cells (bits) on a DRAM chip are expected to reach about 256 million and by the year 2001 the bit count on the DRAM chip is expect to reach about 1 Gigabits.

With this rapid increase in the number of memory cells on the DRAM chip, and the need to maintain a reasonable chip size with improved circuit performance, the area of the individual cells must be further reduced in size. As the cell size decreases it becomes more difficult to fabricate a stacked capacitor with sufficient capacitance to store the necessary charge to provide an acceptable signal-to-noise level for the read circuit (sense amplifiers) to detect. The reduced charge also necessitates increasing the refresh cycle frequency that periodically restores the charge on these volatile storage cells. Since the capacitor area is limited to the cell size in order to accommodate the multitude of cells on the DRAM chip, it is necessary to explore alternative methods for increasing the capacitance without increasing the lateral area that the capacitor occupies on the substrate surface.

Many three-dimensional stacked storage capacitor structures have been reported in the literature for increasing the capacitance, but generally require additional processing steps that including optical alignment and exposure for photoresist masks. For example, C. Koh in U.S. Pat. No. 5,364,813, teaches a method of forming a fin-shaped like capacitor. The method includes depositing a polysilicon layer on the substrate having a sacrificial borophosphosilicate glass (BPSG) in which the capacitor node contact openings are etched. The bottom capacitor electrodes are then formed by patterning the polysilicon layer using a photoresist mask aligned to the contact. Another capacitor structure is reported by Y. Park et al, U.S. Pat. No. 5,332,685 in which the bit line and storage node contacts are formed by simultaneously forming polysilicon plugs. The bit lines are then formed from a polysilicon or polycide layer by aligning a photoresist mask and patterning the polysilicon layer. Fork-shaped bottom electrodes are then formed over the storage node contacts adjacent to the bit lines which restricts the size of the electrode. Still another fork-shaped electrode type capacitor is reported by J. Ahn, U.S. Pat. No. in which the bottom electrode of the capacitor is aligned over a conducting plug in the node contact.

As the DRAM cell continues to decrease in size it becomes increasing more important to reduce the number of mask alignment steps to minimize the ground rule tolerance and improve the cell density. Therefore, there is still a strong need in the semiconductor industry for making a reliable low cost DRAM product using improved processing steps.

SUMMARY OF THE INVENTION

Because the DRAM cells are decreasing in size, for example, having linear dimensions less than a micrometer, it is becoming increasingly more difficult to align one photoresist masking level to the next. To avoid this limitation in alignment tolerances, the present invention provides a method for fabricating the bottom electrodes of the storage capacitors with increasing capacitance while using a single photoresist masking step, and a series of self-aligning process techniques.

It is therefore a principal object of the present invention to provide an array of dynamic random access memory (DRAM) cells having stacked capacitor with fork-shaped electrodes and increased capacitance.

It is another object of the present invention to fabricate these stacked capacitors using a single photoresist masking step and self-aligning techniques to make the capacitor bottom electrodes.

It is still another object of the invention to provide these improved high capacitance stacked capacitor on DRAM cells using a cost effective manufacturing process.

The method for fabricating dynamic random access memory cells having these stacked storage capacitors begins by providing an array of device areas on a semiconductor substrate, such as on a single crystal silicon substrate doped with a P-type conductive dopant (e.g. boron). The device areas are provided by forming a relatively thick field oxide surrounded and electrically isolated each device areas. One method of forming the field oxide areas is by protecting the device areas from oxidation by depositing and patterning a silicon nitride (Si3N4) layer and thermally oxidizing the exposed field oxide areas on the silicon substrate. This method is typically referred to in the semiconductor industry as the LOCal Oxidation of Silicon (LOCOS) method. After removing the silicon nitride layer a thin gate oxide is formed on the silicon substrate in the device areas, and first polysilicon layer having a cap oxide (SiO2) is patterned to form the FET gate electrodes, and interconnecting word lines. Lightly doped source/drain areas are formed adjacent to the gate electrodes, usually by ion implantation of an N-type dopant, such as arsenic (As) or phosphorus (P), and then sidewall spacer are formed, usually by depositing an insulator (SiO2) and anisotropically etching back. The FETs are then completed by using a second N-type dopant implant to form the FET source/drain contact areas. A first insulating layer, such as silicon oxide is deposited in which are etched bit line contact openings to one of the two source/drain contact areas of each FET. The bit line interconnections are formed next by depositing and patterning a doped second polysilicon layer or polycide layer (polysilicon and silicide).

The fork-shaped stacked capacitors, by the method of this invention, are now fabricated by depositing a second insulating layer over and insulating the bit line metallurgy and depositing a third, much thicker third insulating layer, preferably composed of a low melting temperature glass, such as borophosphosilicate glass (BPSG). The BPSG is then annealed for a sufficient time to essentially form a planar surface on the BPSG. Contact openings are anisotropically etched in the third, second and first insulating layers to the second source/drain contact area of each FET to form the node contact openings for the bottom electrodes of the stacked storage capacitors. A conformal third polysilicon layer, in situ doped with an N-type dopant (e.g. phosphorus) is then deposited thereby filling the node contact openings, and forming a uniformly thick and planar third polysilicon layer elsewhere on the planar third insulating layer. This third polysilicon layer is etched back to the third insulating layer, and thereby forms polysilicon plugs electrically contacting the source/drain contact areas in the node contact openings, and the top surface of the plugs and third insulating layer being essentially co-planar. The third insulating layer is now partially and selectively etched back exposing top portions of the polysilicon plugs, the exposed top portions of the polysilicon plugs extending above the recessed surface of the third insulating having essentially vertical sidewalls. A conformal fourth polysilicon layer is deposited on the top portions of the polysilicon plugs, and elsewhere on the third insulating layer. A conformal fourth insulating layer, preferably composed of a silicon nitride (Si3N4) is deposited on the fourth polysilicon layer, and anisotropically blanket etched back to the fourth polysilicon layer, and thereby forming insulating sidewall spacers on the polysilicon plugs. A conformal fifth polysilicon layer is deposited on the polysilicon plugs, on the insulating sidewall spacers, and elsewhere on the fourth polysilicon layer, and is then anisotropically blanket etched back, and further the same etch back is used to etch back the fourth polysilicon layer on the polysilicon plugs and elsewhere on the substrate. This results in the formation an array of fork-shaped bottom capacitor electrodes electrically isolated from each other. The remaining portions of the fourth insulating layer (Si3N4) are completely removed using a selective isotropic etch, such as a hot phosphoric acid solution. The stacked storage capacitors are now completed by forming on the exposed surface of the capacitor bottom electrodes a capacitor dielectric layer, and then depositing and patterning a sixth polysilicon layer, thereby forming top capacitor electrodes and completing the array of fork-shaped stacked storage capacitors for the DRAM cells.

BRIEF DESCRIPTION OF THE DRAWINGS

The objects and advantages of this invention are best understood with reference to the attached drawings in the FIGS. and the embodiments which follows.

DESCRIPTION OF THE PREFERRED EMBODIMENT

Now in keeping with the objects of this invention, the method for forming a DRAM cell having these improved fork-shaped stacked capacitor is described with reference to FIGS. 1 through 16. The DRAM cell is usually formed on a P-doped semiconductor substrates using N-channel field effect transistor (N-FET) structures as the pass transistor in each of the DRAM cells. It should also be well understood by one skilled in the art that by including additional process steps, in addition to those described in this embodiment, other types of devices can also be included on the DRAM chip, For example, by forming N-Well regions in the P doped substrate, P-channel FETs can also be provide from which Complementary Metal-Oxide-Semiconductor (CMOS) circuits can also be formed, such as are used for the peripheral circuits on the DRAM chip.

Figure 1:
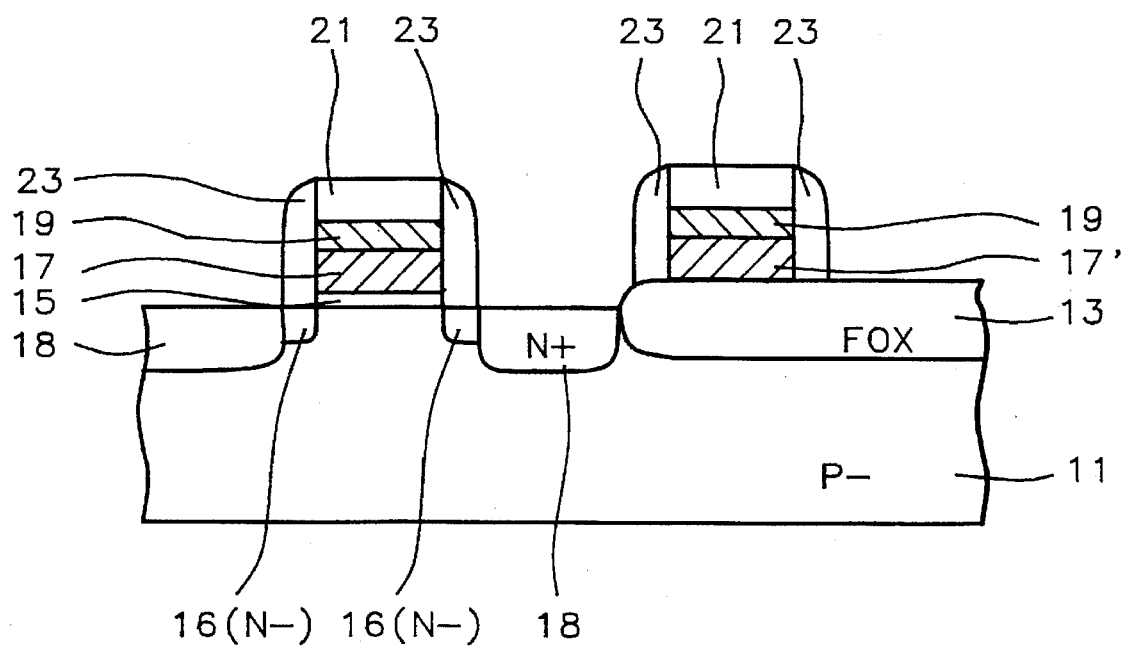
FIGS. 1 through 15 show schematic cross-sectional views for one of the cell regions of an array of DRAM cells illustrating the fabrication steps for the DRAM cell having the fork-shaped stacked storage capacitor by the method of a first embodiment of this invention.

Referring first to FIG. 1, a schematic cross-sectional view of a portion of semiconductor substrate 11 is shown having a partially completed DRAM cell with a pass transistor (N-FET) formed on and in the substrate surface. The preferred substrate is usually composed of a lightly P-type single crystal silicon having preferably a <100> crystallographic orientation. A relatively thick Field OXide (FOX) 13 is formed surrounding and electrically isolating the individual device regions in which the memory cells are built. The field oxide 13, only partially shown in FIG. 1, is most commonly formed by the LOCal Oxidation of Silicon (LOCOS) method. This LOCOS method involves depositing a thin silicon oxide (pad oxide) and a thicker silicon nitride layer as an oxidation barrier layer on the substrate surface (not shown in FIG. 1), and using conventional photolithographic techniques and etching to remove the barrier layer in areas where a field oxide is desired, while retaining the silicon nitride in areas where active devices are to be fabricated. The silicon substrate is then subjected to a thermal oxidation to form the field oxide areas 13. The oxide is usually grown to a thickness in the range of between about 3000 to 6000 Angstroms.

The semiconductor device (N-FET) is now formed in the active device regions after removing the silicon nitride barrier layer and pad oxide in a wet etch. For example, the nitride can be removed in a hot phosphoric acid ($H_3PO_4$) etch at about 180° C., and a pad oxide can be removed in a dilute solution of hydrofluoric acid and water ($HF/H_2O$). The gate oxide for the N-FETs are formed next in the device areas by thermally oxidizing the active device region to form a thin gate oxide 15, as shown in FIG. 1. Typically, the thickness of the gate oxide 15 is between about 50 to 150 Angstroms.

Referring still to FIG. 1, the FET gate electrodes in the device areas and the interconnecting word lines on the field oxide 13 are formed next by patterning a multilayer composed of a first polysilicon layer 17, a silicide layer 19 and a cap oxide layer 21, as shown in FIG. 1, using conventional photolithographic techniques and plasma etching. The first polysilicon layer 17 is deposited using low pressure chemical vapor deposition (LPCVD), and a reactant gas, such as silane ($SiH_4$). The polysilicon layer 17 is then doped with an N-type conductive dopant by, for example, ion implantation with arsenic ions ($As^{75}$) or phosphorus ions ($P^{31}$). Typically the polysilicon layer 17 is between about 2000 to 4000 Angstroms thick, and is doped to a concentration of between about 1.0 E 19 to 1.0 E 21 atoms/cm$^3$. A refractory silicide layer 19, such as tungsten silicide (WSi2), is formed on the polysilicon layer 17 by physically depositing a tungsten (W)

metal and then sintering to form the silicide or alternatively, the tungsten can be formed by chemical vapor deposition (CVD) using tungsten hexafluoride ($WF_6$) as the reactant gas. The silicide serves to reduce the electrical resistance in the interconnecting word lines and improve circuit performance. Typically, the $WSi_2$ is about 500 to 2000 Angstroms thick. The cap oxide 21, usually composed of silicon oxide ($SiO_2$) is also deposited using LPCVD by decomposing a reactant gas, such a tetraethosiloxane (TEOS), and is provided over the silicide to electrically insulate the gate electrodes from the bit lines that are later formed. Typically, the thickness of the cap oxide layer 21 is between about 800 to 1600 Angstroms.

Lightly doped source/drain areas 16 are formed next adjacent to the gate electrode 17. The lightly doped source and drain areas for the N-FETs are formed by ion implantation of an N-type dopant, such as arsenic or phosphorus. For example, a typical implant might consist of phosphorus $P^{31}$ at a dose of between 1 E 13 to 10 E 13 atoms/cm$^2$ and an energy of between about 30 to 80 Kev. The gate electrodes serve as an implant mask to self-align the source/drain to the electrode, while an additional photoresist mask can be used to avoid unwanted implants elsewhere on the substrate.

After forming the lightly doped source/drain 16, sidewall spacers 23 are formed on the sidewalls of the gate electrode 17, also shown in FIG. 1. These sidewall spacers are typically formed by depositing a low temperature silicon oxide, and then anisotropically etched back to the silicon surface. For example, the sidewall oxide can be deposited using LPCVD and tetraethoxysilane (TEOS) at a temperature in the range of about 650° to 900° C. and the etch back performed in a low pressure reactive ion etcher. An N$^+$ source/drain ion implantation is then used to complete the source/drain areas forming the N$^+$ doped source/drain contact areas 18 aligned to the sidewall spacers 23 and therefore also aligned to the lightly doped source/drain areas 16, as depicted in FIG. 1.

Figure 2:
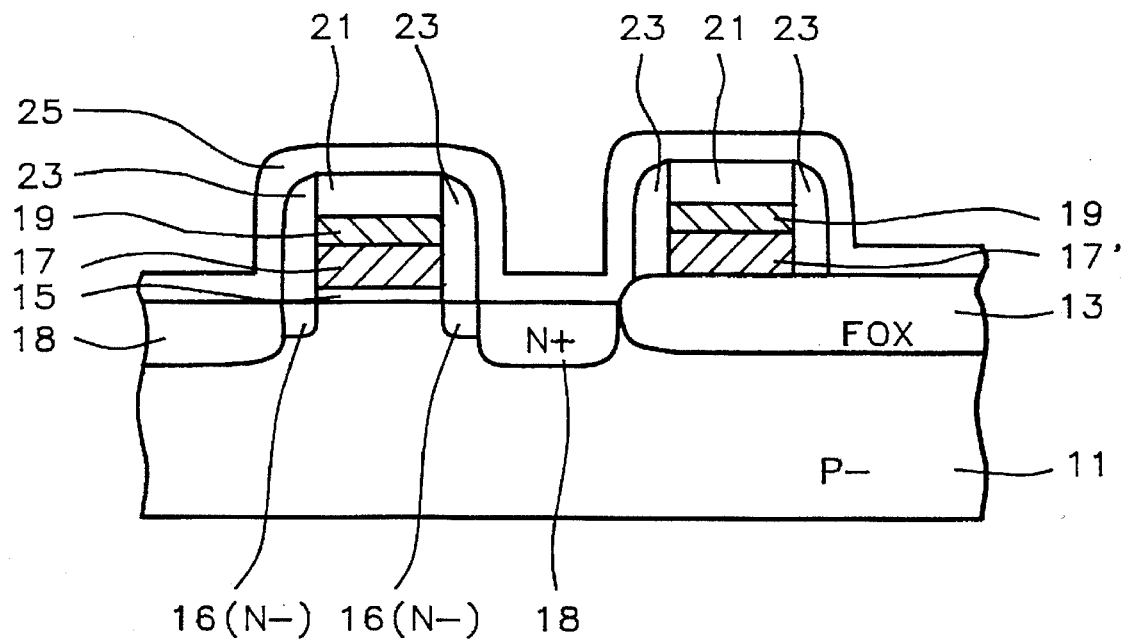
Figure 3:
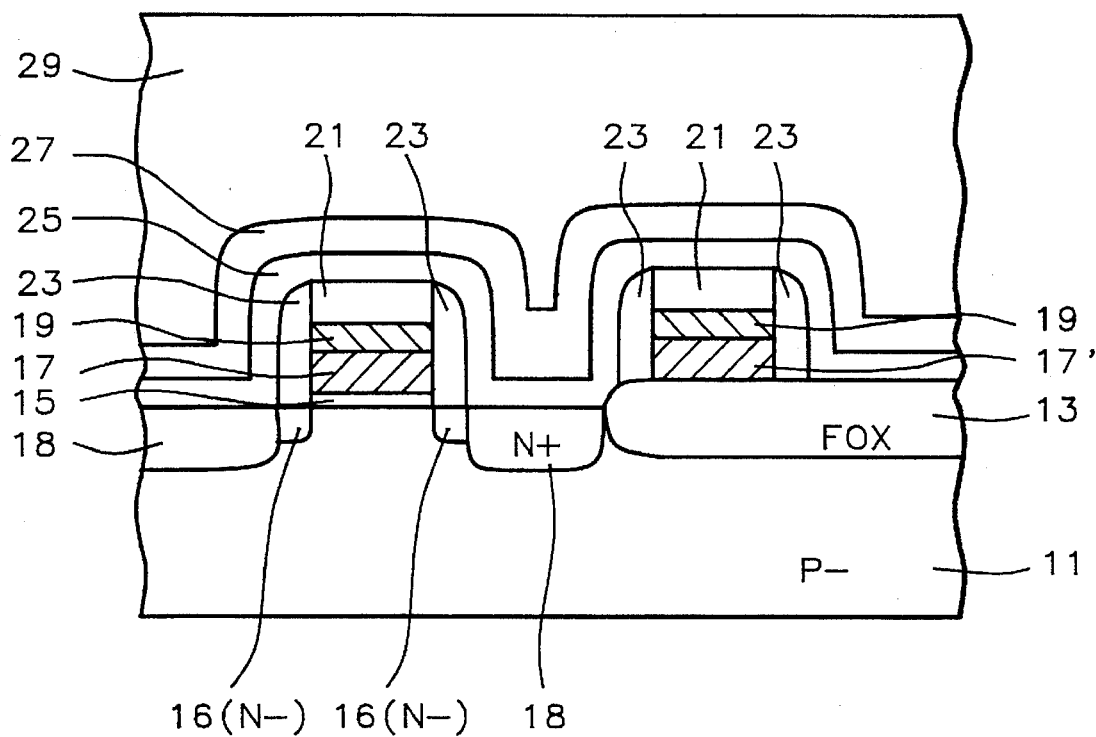

Referring now to FIG. 2, a second insulating layer 25 is blanket deposited on the substrate 11 as an electrical insulating layer over the exposed source/drain contacts, and then bit line contact openings (not shown in FIG. 2) are etched to one of the two source/drain contact areas 18 of each of the DRAM FET. The cross section in FIG. 2 is through a region that does not depict the bit line contact opening or bit line metallurgy, but is here briefly described. After depositing the second insulating layer 25 preferably composed of a LPCVD silicon oxide (e.g. TEOS) and having a preferred thickness of between about 500 to 1000 Angstroms, the bit line contacts are formed, and a second polysilicon layer having a metal silicide on the surface is deposited and patterned similar to the process for forming the gate electrode/word line metallurgy, without however, having a cap oxide. During the formation of the bit line contacts other non-bit-line contacts can also be formed elsewhere on the substrate. Typically, the second polysilicon is doped with an N-type dopant, such as phosphorus, similar to the first polysilicon layer 17 and is between about 500 to 1500 Angstroms thick. After completing the bit line metallurgy, a conformal third insulating layer 27 is deposited over the bit lines to electrically insulate the bit lines from the subsequent conducting layers, as shown in FIG. 3. Layer 27 is also deposited using LPCVD and the decomposition TEOS, and is deposited to a preferred thickness of between about 1000 to 2000 Angstroms.

Referring now to FIGS. 3 through 16, the remainder of this embodiment addresses more specifically the method of fabricating the array of improved fork-shaped stacked storage capacitor on the DRAM device. In accordance with the objects of this invention, a single masking step is used to form the bottom capacitor electrode (capacitor node electrode). This single masking level is used to form the node contact openings for the stacked storage capacitors to the second of the two source/drain contact areas of each FET in the DRAM cells, and then a series of deposition steps and etch back steps are used to complete the bottom electrodes for the stacked storage capacitors that are now self-aligned to the node contact openings.

The method begins, as shown in FIG. 3, by first depositing a relatively thick fourth insulating layer 29 on the substrate 11 over the third insulating layer 27 and then planarized layer 29. One preferred method for forming an essentially planar insulating layer is to deposit an insulating layer having a low glass transition temperature and then annealing at a temperature greater than the glass transition temperature to level the layer. For example, one preferred insulating layer is a borophosphosilicate glass (BPSG) which can be deposited by LPCVD using a reactant gas mixture of silane ($SiH_4$) and oxygen ($O_2$) or alternatively, by the decomposition of tetraethosiloxane (TEOS) while in situ doping the silicon oxide using a dopant gas such as phosphine ($PH_3$) an diborane ($B_2H_6$). The preferred thickness of layer 29 is between about 5000 to 10000 Angstroms, and is annealed at a temperature of about 850° to 950° C. for about 10 to 30 minutes to achieve an essentially planar surface.

Figure 4:
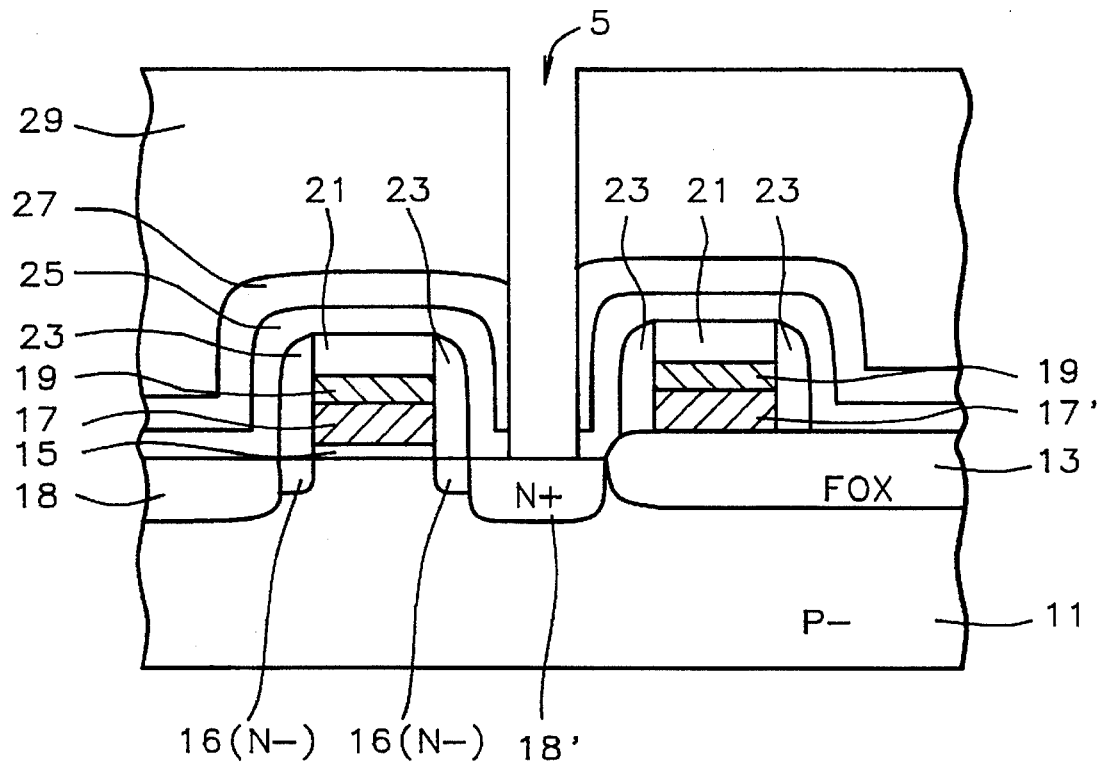
Figure 5:
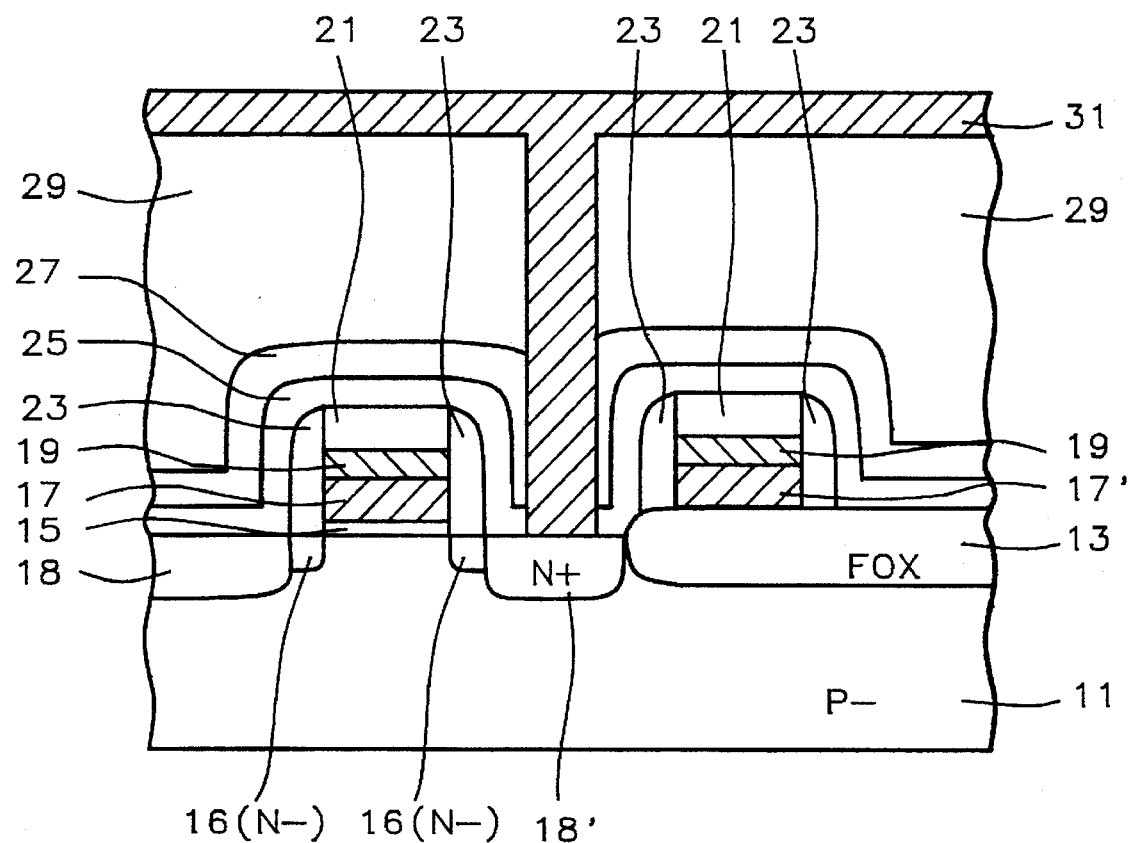

Now as shown in FIG. 4, conventional photolithographic techniques and anisotropic etching are used to etch the node contact openings in the insulating layers 29, 27 and 25 to source/drain contact areas chosen for the capacitor node contacts, one of which is shown in FIG. 4 an labeled 18'. The anisotropic etching is preferably done in a low pressure plasma etcher or reactive ion etcher (RIE) using an etch gas or gas mixture that is anisotropic (directional) in silicon oxide and further has a high etch rate selectively of silicon oxide to silicon. For example, one preferred etch gas is trifluoroethane ($CHF_3$) or alternatively, a gas mixture of carbon tetrafluoride ($CF_4$) and hydrogen ($H_2$) can be used, and either gas mixture can be combined with a carrier gas, such as argon (Ar) of helium (He). As can also be seen in FIG. 4, the node contact opening 5 has an essentially vertical sidewall in the BPSG glass and is an important feature of the invention, A blanket conformal third polysilicon layer 31 is now deposited on the planarized third insulating layer 29 sufficiently thick to completely fill the contact openings, as depicted for opening 5 in FIG. 5. The polysilicon layer 31 is preferably deposited by low pressure chemical vapor deposition (LPCVD) using silane ($SiH_4$), and is in situ doped by adding a dopant gas, such as phosphine or arsine ($AsH_3$) to the silane. The preferred thickness of polysilicon layer 31 is between about 1000 to 2000 Angstroms, and is in situ doped to a concentration of between about 5.0 E 19 to 1.0 E 21 atoms/cm$_3$. Layer 31 is sufficiently thick so as to also form a planar surface on the planarized third insulating layer 29 over the node contact openings, as also depicted in FIG. 5.

Figure 6:
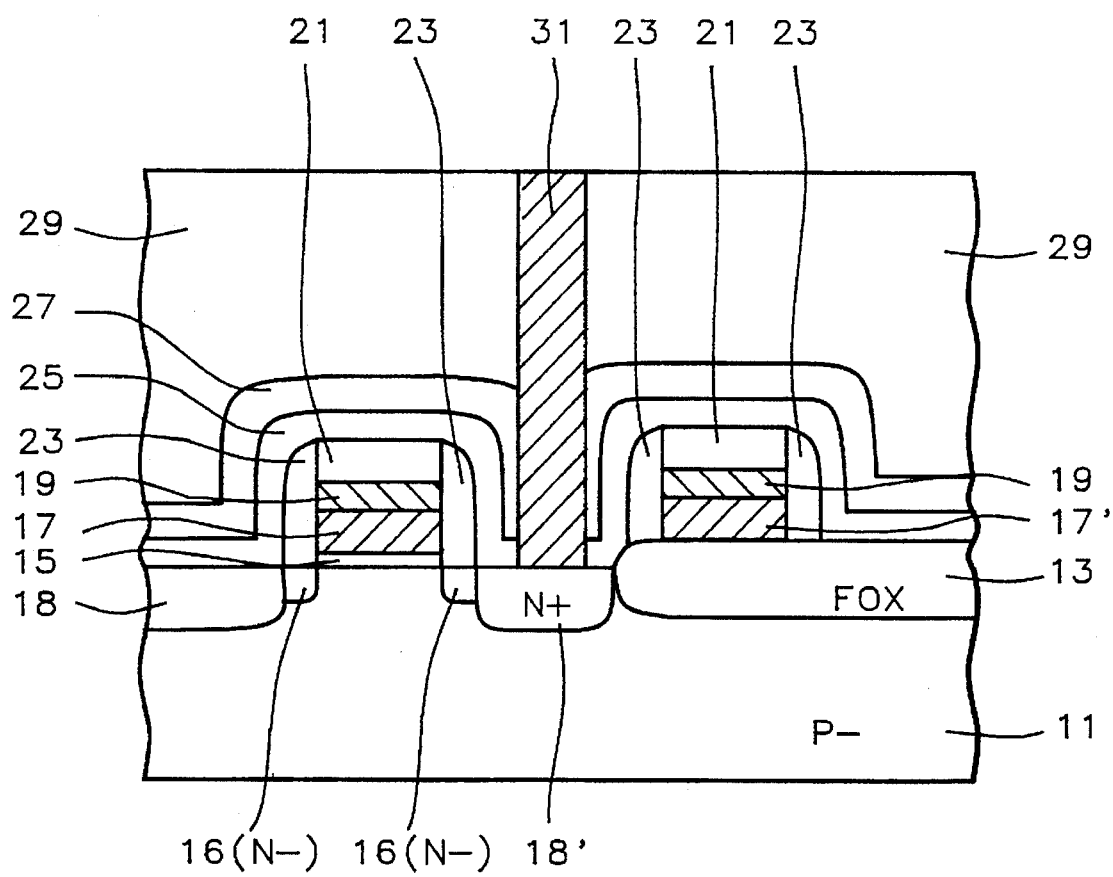

Referring now to FIG. 6, the third polysilicon layer 31 is etch backed selectively to the surface of the third insulating layer 29 composed of BPSG. For example, a low pressure plasma etch can be used, such as reactive ion etching (RIE) using a reactive etch gas mixture containing a chlorine ($Cl_2$) species and a carrier gas, such as argon (Ar). The etch back results in the formation an array of doped polysilicon plugs in the array of node contact openings, forming ohmic contacts to the source/drain contact areas 18, as depicted for one of the contact openings labeled 5 in FIG. 6.

Figure 7:
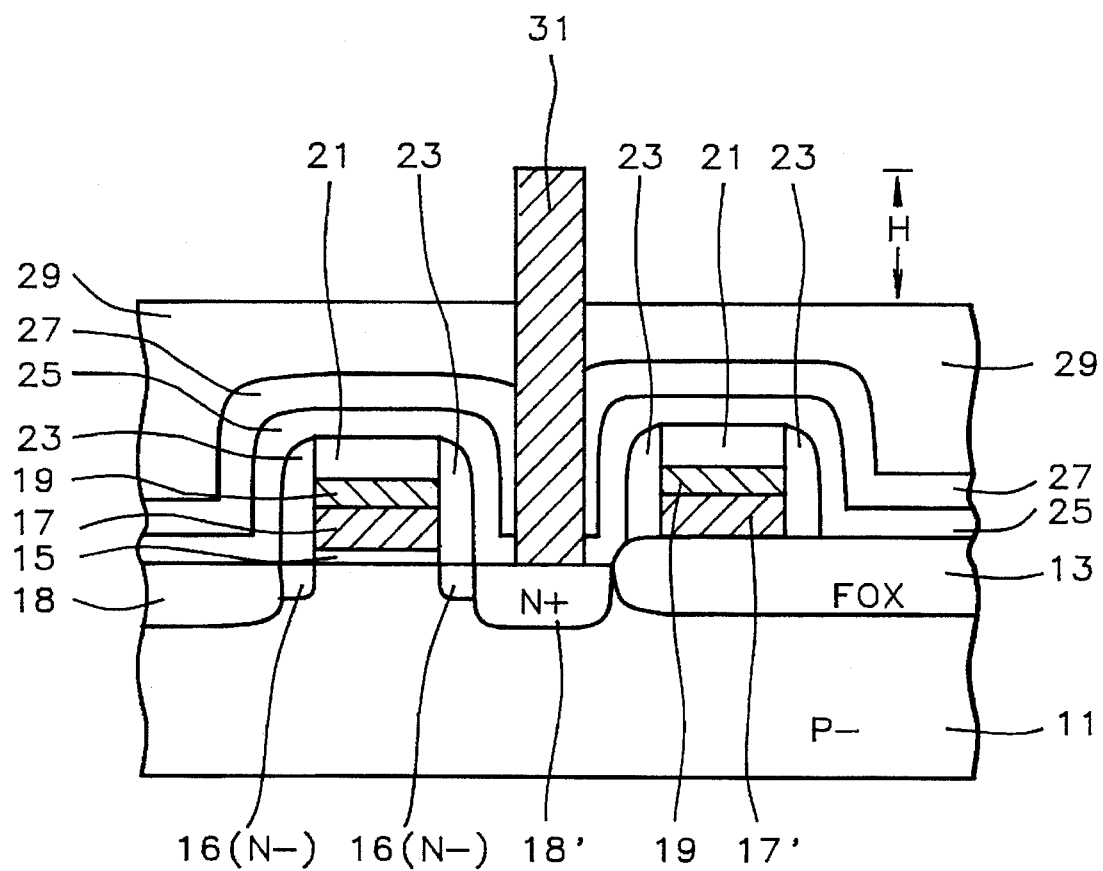

The exposed third insulating layer 29, composed of the BPSG, is now partially etched back to expose the upper portions of the array of polysilicon plugs, as shown for one of the plug labeled 31 in FIG. 7. The etch back is carried out in a plasma etcher using, for example, an etch gas mixture such as carbon tetrafluoride and argon. As shown in FIG. 7, the insulating layer 29 is etched back to expose a predetermined portion of the upper part of the plug 31 having a height H above the surface of layer 29 after etch back. The plugs replicating the contact opening having essentially vertical sidewalls. The height H, as will soon be seen, determines the height of the fork-shaped portion of the bottom electrode and fork-shaped portion is further self-aligned to the upper portion of the polysilicon plug 31, thereby improving the cell array density on the DRAM chip. The etch back of layer 29 (depth), and therefore the height H of the upper portion of the plug is preferably between about 4000 to 8000 Angstroms.

Figure 8:
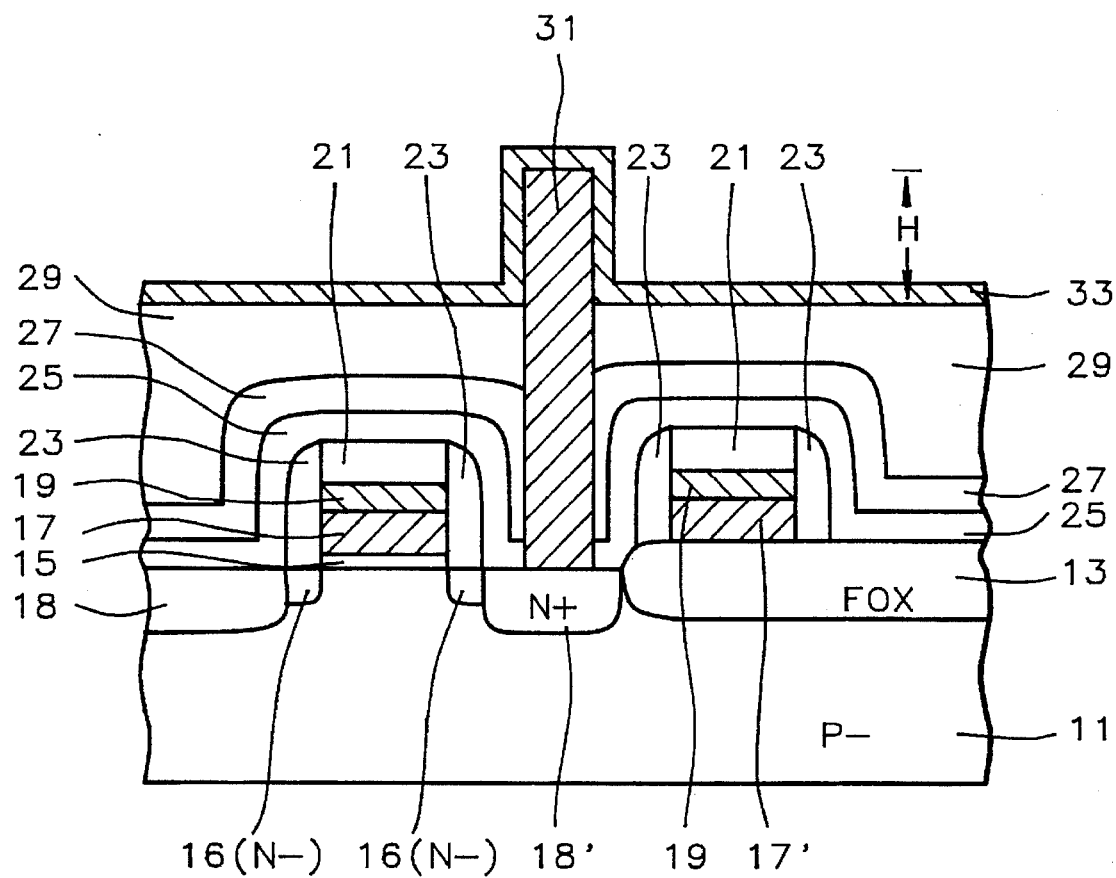

Next, a conformal fourth polysilicon layer 33 is blanket deposited over the upper portion of the polysilicon plug 31, and elsewhere on the substrate over the recessed third insulating layer 29, as shown in FIG. 8. Layer 33 is preferably deposited using LPCVD using silane as previously described for the third polysilicon layer 31, and having an $N^+$ dopant concentration of between about 5.0 E 19 to 1.0 E 21 atoms/cm$^3$. The preferred thickness of layer 33 is between about 300 and 1000 Angstroms.

Figure 9:
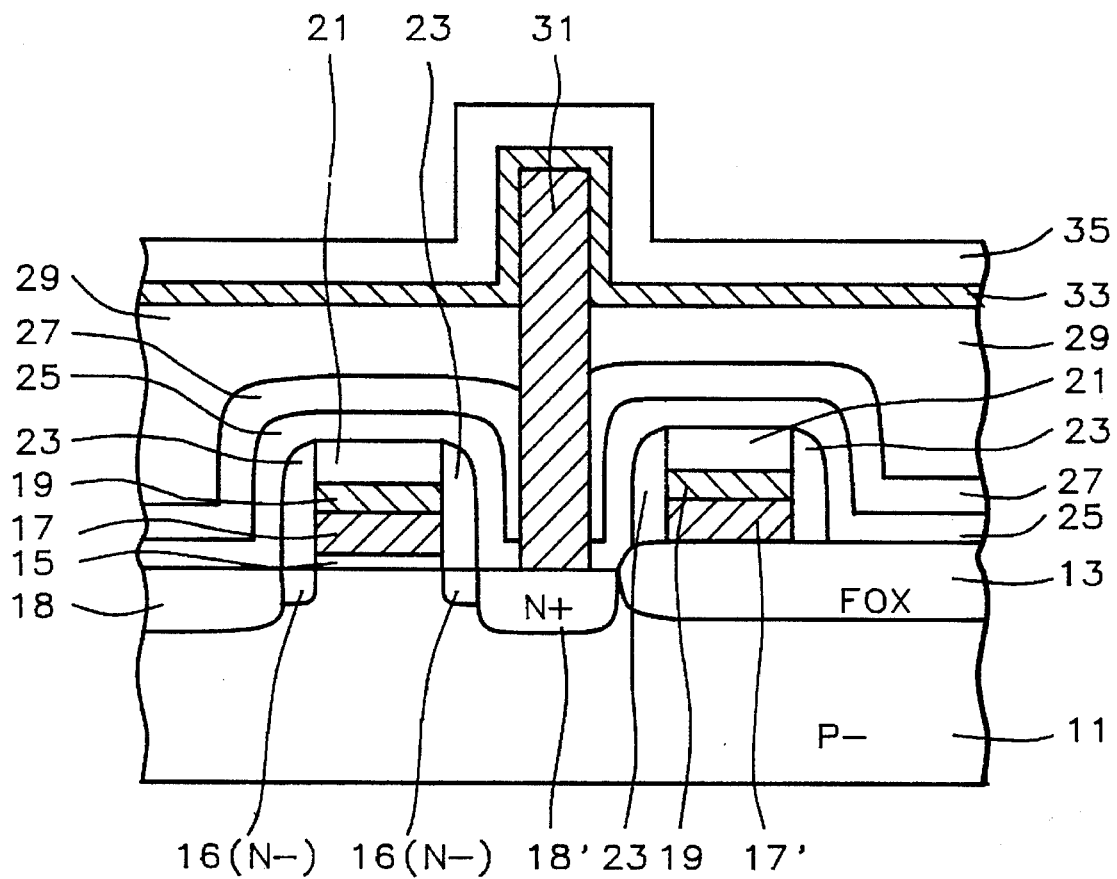
Figure 10:
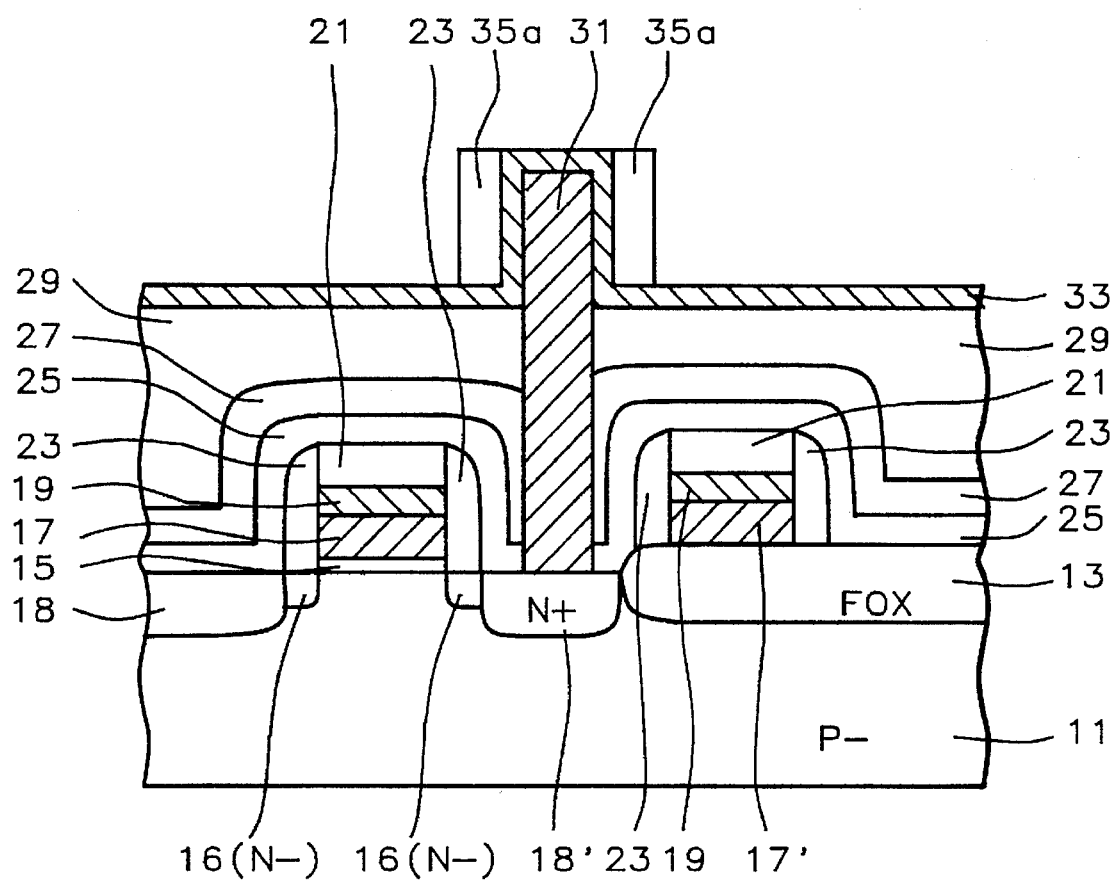

Referring now to FIG. 9, a conformal fourth insulating layer 35 is deposited, preferably composed of silicon nitride ($Si_3N_4$) and deposited using, for example, low pressure chemical vapor deposition (LPCVD) and a reactant gas mixture such as dichlorosilane ($SiCl_2H_2$) and ammonia ($NH_3$). Alternatively, the silicon nitride layer 35 can also be deposited using plasma enhanced chemical vapor deposition (PECVD), for example, using silane ($SiH_4$) and ammonia ($NH_3$). The thickness of the silicon nitride layer 35 is preferably between about 1000 to 3000 Angstroms. The silicon nitride layer 35 is then anisotropically etched back to the fourth polysilicon layer 33, thereby forming silicon nitride spacers 35A, on the sidewalls of the upper portion of the polysilicon plugs 31, as shown in FIG. 10.

Figure 11:
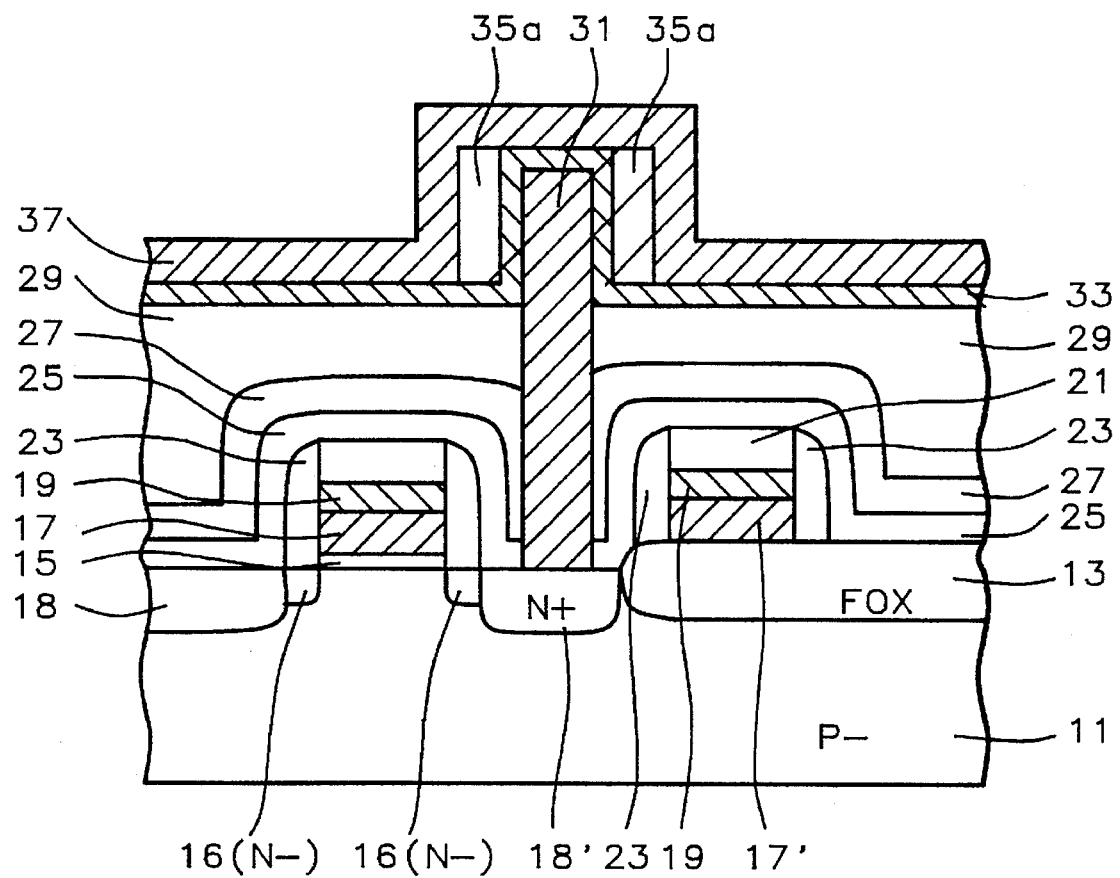
Figure 12:
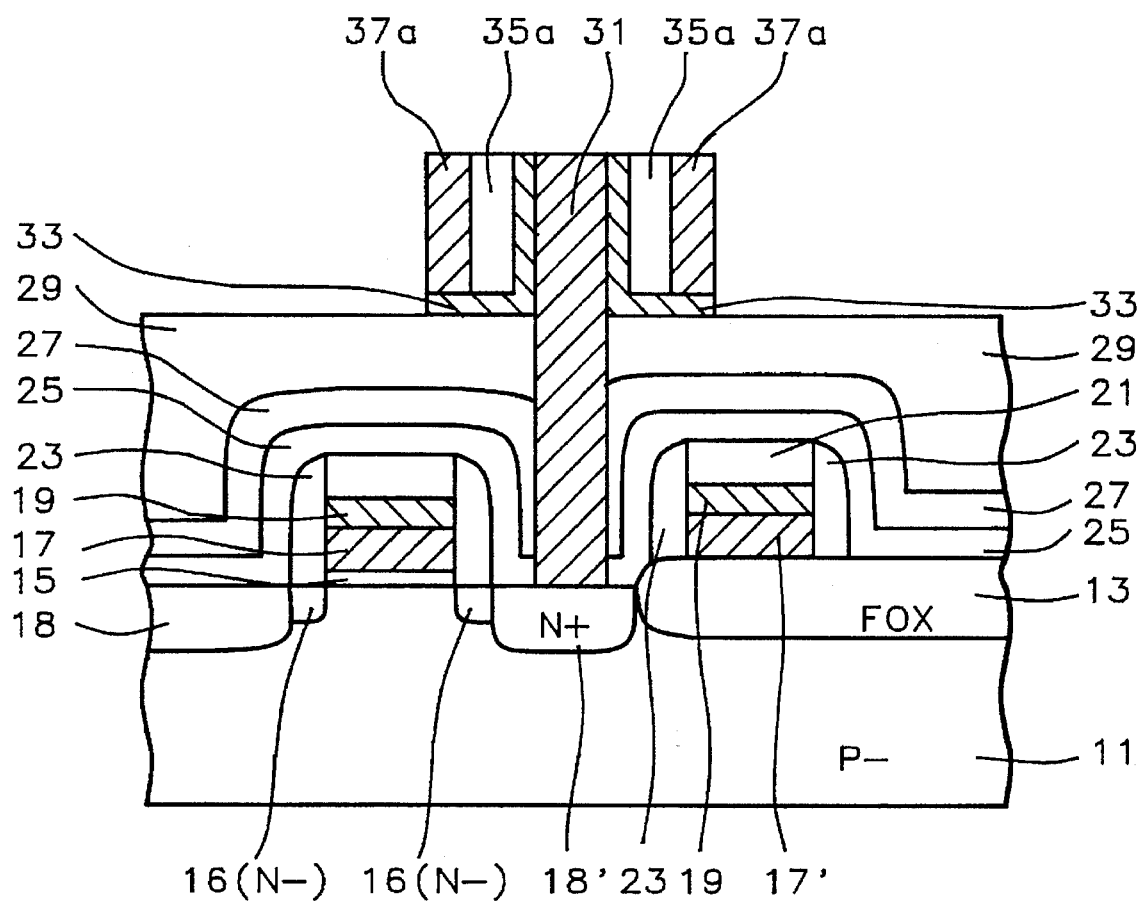

After forming the silicon nitride sidewall spacers 35A, a fifth polysilicon layer 37 is conformally deposited over the polysilicon plugs 31, the sidewall spacers 35A, and elsewhere on the exposed fourth polysilicon layer 33, as shown in FIG. 11. Polysilicon layer 37 is also deposited by LPCVD using, for example, silane and is also doped with an N-type conductive dopant, such as phosphorus (P) having a phosphorus concentration of between about 5.0 E 19 to 1.0 E 21 atoms/cm$^3$. The preferred thickness of layer 37 is between about 1000 to 2000 Angstroms. The fifth polysilicon layer 37 is now anisotropically etched back in a low pressure plasma etcher, such as a reactive ion etcher to form polysilicon sidewall spacers 37A, as shown in FIG. 12. During the same plasma etch the fourth polysilicon layer 33 is also removed over the third insulating layer 29 surrounding the polysilicon plugs 31 having the sidewall spacers 35A and the polysilicon sidewall spacers 37A, and thereby forming an array of fork-shaped bottom capacitor electrodes that are electrically isolated between the DRAM cells.

Figure 13:
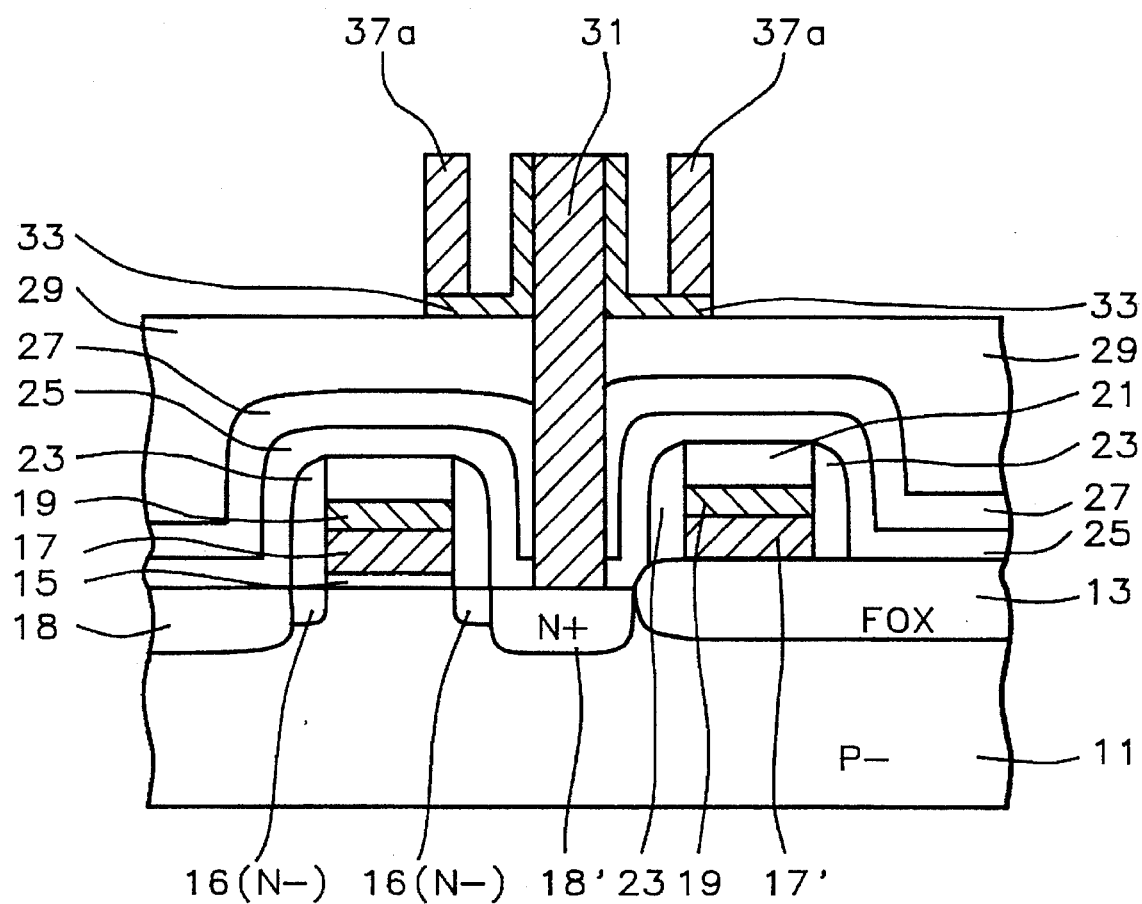

Now as shown in FIG. 13, the silicon nitride sidewall spacers 35A are selectively removed by etching, for example, in a hot phosphoric acid etch ($H_3PO_4$), to leave free standing an array of fork-shaped bottom capacitor electrodes. The polysilicon layers 31, 33, and the BPSG layer 29 remain essentially unetched during the nitride etch in the hot phosphoric etch. The free standing bottom electrode composed of the polysilicon plugs 31, the polysilicon sidewall spacer 37A, and the interconnecting layer 33 substantially increases the capacitor surface area, and therefore the capacitance of the stacked capacitors.

Figure 14:
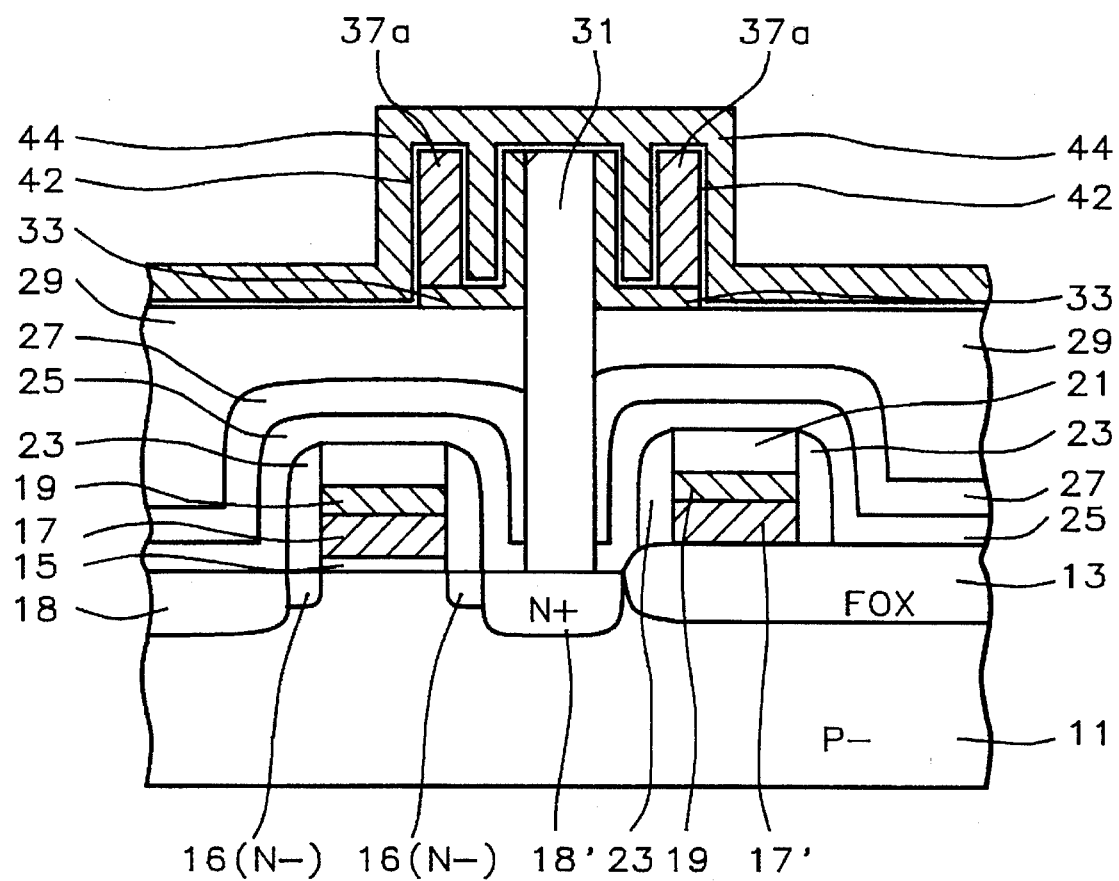
Figure 15:
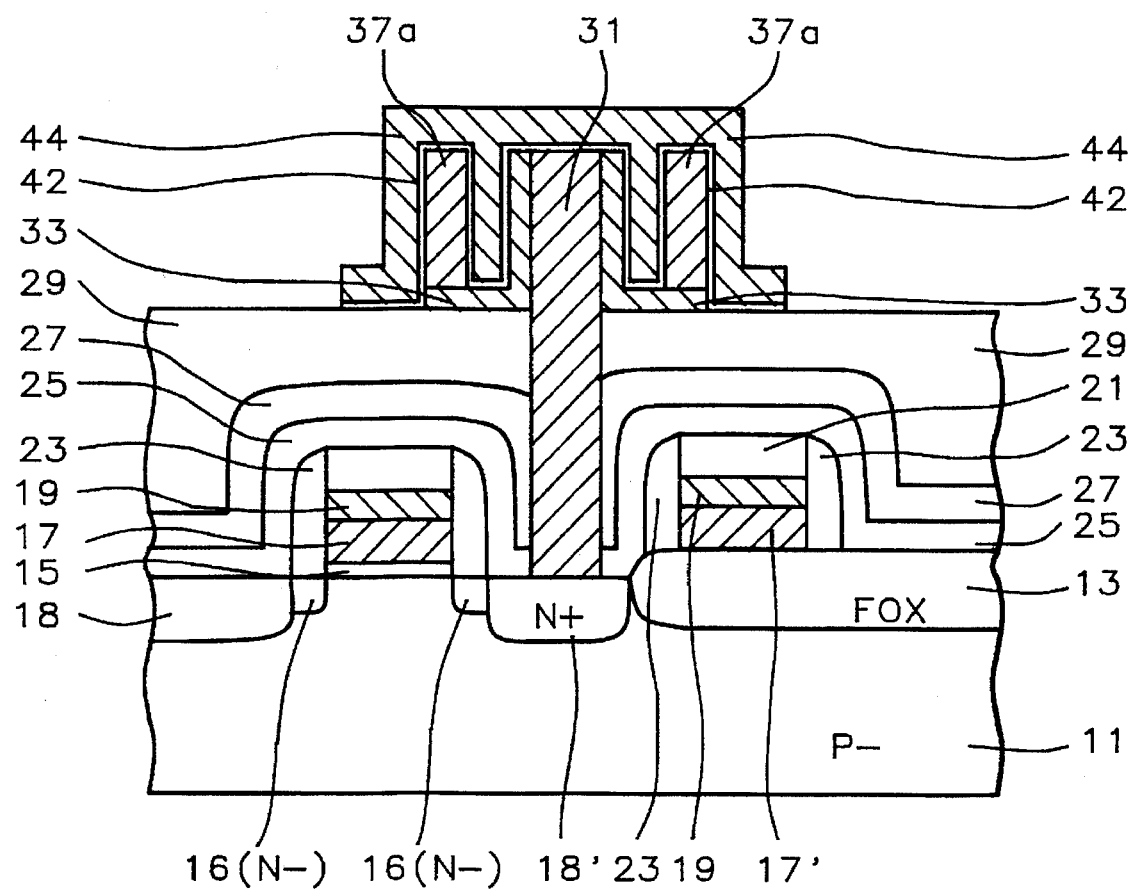

The fork-shaped stacked storage capacitors for the DRAM cells are now completed, as shown in FIG. 14 and 15. The process involves forming a capacitor interelectrode dielectric layer 42 on the surface of the capacitor bottom electrodes composed of plugs 31, sidewall spacers 37A and layer 33. The dielectric layer 42 is preferably composed of silicon nitride and silicon oxide ($Si3N_4/SiO_2$) or layers of silicon oxide, silicon nitride and silicon oxide (ONO). For example, the dielectric layer 42 composed of silicon nitride and silicon oxide can be formed by depositing a silicon nitride layer using low pressure chemical vapor deposition (LPCVD) and a reactive gas mixture of ammonia ($NH_3$) and dichlorosilane ($SiH_2Cl_2$) followed by oxidation of the silicon nitride layer in a wet oxygen at a temperature of about 850° C. for about 10 minutes. The preferred total thickness of the interelectrode dielectric layer 42 is between about 30 to 100 Angstroms. In addition, other commonly practiced method can be used to further increase the capacitance, such as roughing the electrode surface and by using interelectrode materials having higher dielectric constants, such as tantalum pentoxide ($Ta_2O_5$).

Also shown in FIG. 14, a sixth polysilicon layer 44 is deposited on the interelectrode dielectric layer 42. The layer 44 conformally covers the bottom electrode and forms the top electrode for storage capacitor. Layer 44 is preferably deposited by LPCVD and is in situ doped N-type. The preferred thickness of polysilicon layer 44 is between about 1000 to 2000 Angstroms and is doped with an N-type dopant impurity, such as with phosphorus (P). The preferred concentration of phosphorus in layer 44 being in the range of between about 5.0 E 19 to 1.0 E 21 atoms/cm$^3$. The polysilicon layer 44 is then patterned using conventional photolithographic techniques and plasma etching to form the top electrodes and complete the array of fork-shaped stacked capacitors, only one of which is depicted in FIG. 15.

Figure 16:
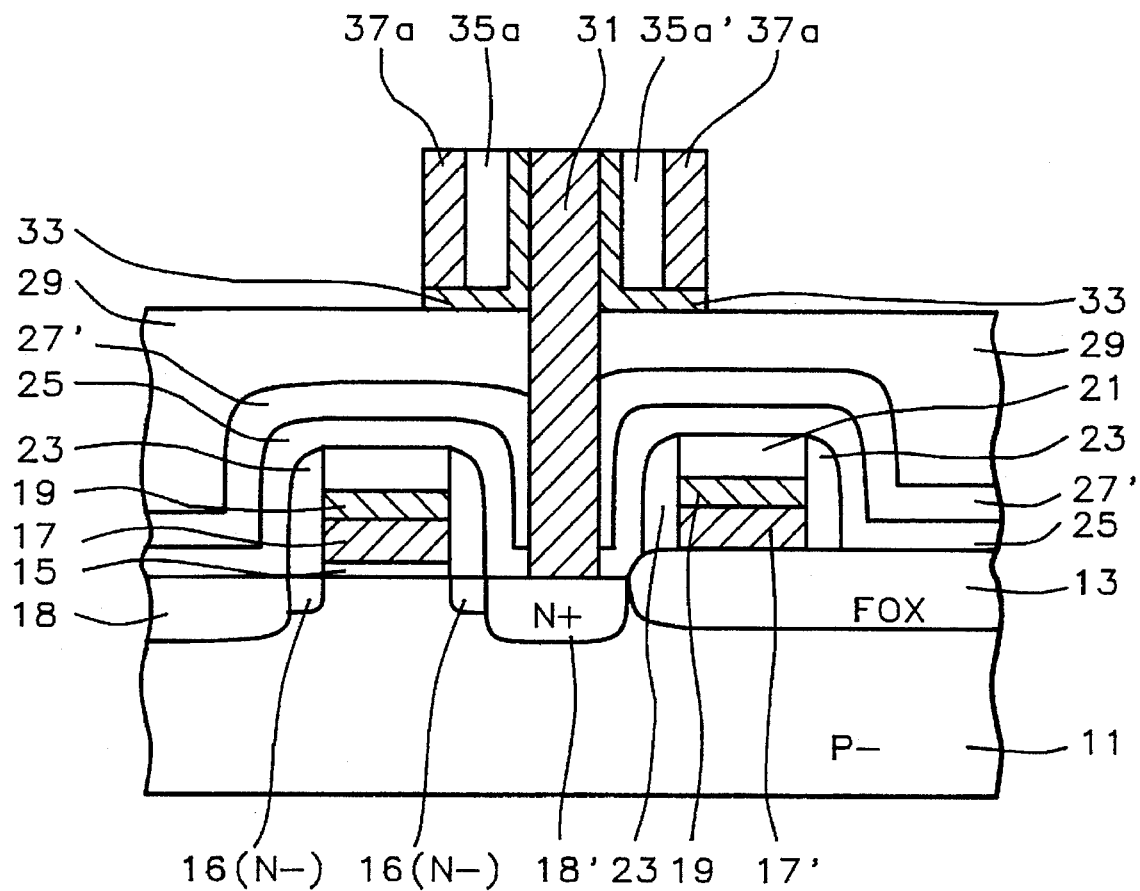
FIGS. 16 through 18 show schematic cross-sectional views for one of the cell regions of an array of DRAM cells by the method of the second embodiment which increases further the capacitance of storage capacitor described in the first embodiment.
Figure 17:
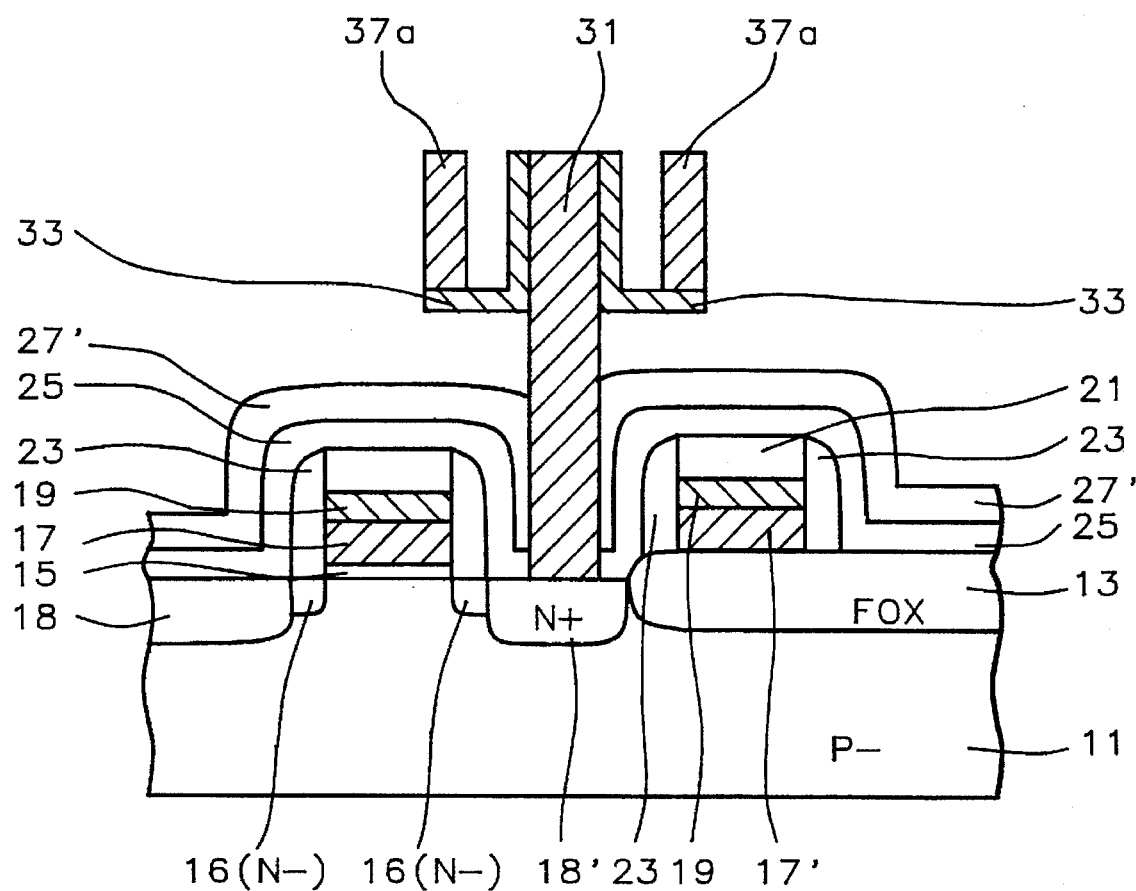
Figure 18:
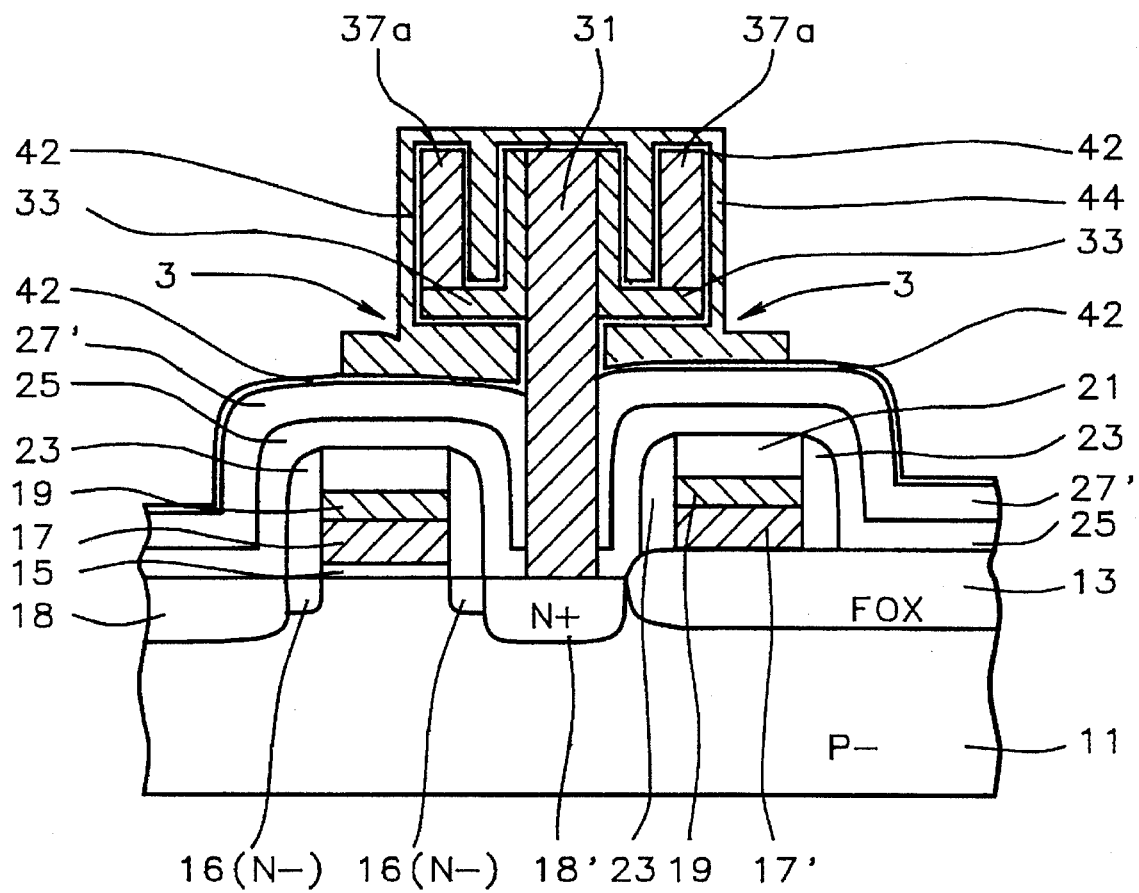

Referring now more specifically to FIG. 16 through 18, a second embodiment of the invention is shown for making the fork-shaped capacitor which further increases the storage node capacitance. The method is similar to the first embodiment up to and including the structure in FIG. 12 with a few minor changes and therefore the layers are labeled the same for the structures shown in the FIGS. for the first embodiment. In the second embodiment the silicon oxide layer 27 in the first embodiment is replaced by a silicon nitride (Si3N4) layer 27', as shown in FIG. 16, and the sidewall spacers 35A formed from the silicon nitride (Si3N4) layer in the first embodiment are replaced by silicon oxide spacers 35A' formed from a silicon oxide (SiO2) layer, as also depicted in FIG. 16.

Now as shown in FIG. 17, the sidewall spacers 35A' and the BPSG layer 29 are removed completely in an isotropic etch, such as hydrofluoric acid solution (HF/H2O), leaving essentially unetched a free standing bottom electrode for the node capacitor and the silicon nitride layer 27'. The removal of BPSG layer 29 under the portion of the electrode composited of layer 33 and sidewall spacer 37A and adjacent to the portion of the pillar 31 expose more of the bottom electrode surface area, and thereby further increase the storage node capacitor area.

Now as shown in FIG. 18, the storage capacitor is completed, as in the first embodiment, by forming a thin capacitor interelectrode dielectric 42 on the surface of the bottom electrode and depositing and patterning a conformal the sixth polysilicon layer 44 to form the top electrodes for the storage capacitors. Since the recessed areas 3 (shown in FIG. 18) are also filled with the patterned polysilicon layer 44 (top electrode), the storage node capacitance is further increased with respect to the storage capacitor in the first embodiment. Both embodiments utilize a self-aligning method for forming the sidewall spacer portions of the capacitors to the source/drain contact openings (opening 5 in FIG. 4) and thereby improve the ground rule tolerances and increase the cell density on the chip.

While the invention has been particularly shown and described with reference to the preferred embodiments thereof, it will be understood by those skilled in the art that various changes in form and details may be made without departing from the spirit and scope of the invention.

What is claimed is:

1. A method for fabricating stacked storage capacitors on a semiconductor substrate, comprising the steps of:

providing a semiconductor substrate having device areas surrounded and electrically isolated from each other by field oxide areas, said device areas having semiconductor devices formed, in part, from a patterned first polysilicon layer, and having contact areas in said devices areas, said substrate coated with a first insulating layer in which are etched contact openings to select contact areas for electrical interconnections, said interconnections composed, in part, from a patterned second polysilicon layer, and further forming said stacked storage capacitors by;

depositing a second insulating layer on said substrate and over said patterned second polysilicon layer, depositing a third insulating layer on said second insulating layer, said third insulating layer being essentially planar, anisotropically etching node contact openings in said third, second and first insulating layers to said device contact areas required for bottom electrodes of said stacked storage capacitors, depositing a conformal third polysilicon layer, and thereby filling said node contact openings, and forming a uniformly thick and planar third polysilicon layer elsewhere on said planar third insulating layer, removing a portion of said third polysilicon layer to said third insulating layer, and thereby forming polysilicon plugs in said node contact openings, partially etching back said third insulating layer and thereby exposing upper portions of said polysilicon plugs, and said polysilicon plug having essentially vertical sidewalls, depositing a conformal fourth polysilicon layer on said upper portions of said polysilicon plugs, and elsewhere on said third insulating layer, depositing a conformal fourth insulating layer on said fourth polysilicon layer, and anisotropically blanket etching back said fourth insulating to said fourth polysilicon layer, and thereby forming insulating sidewall spacers on said polysilicon plugs from said fourth insulating layer, depositing a conformal fifth polysilicon layer on said polysilicon plugs, on said insulating sidewall spacers, and elsewhere on said fourth polysilicon layer, and anisotropically blanket etching back said fifth polysilicon layer, and further by said same etch back, etching back said fourth polysilicon layer elsewhere on the substrate, and thereby forming an array of fork-shaped bottom capacitor electrodes electrically isolated from each other, etching isotropically and selectively removing the insulating sidewall spacers between said polysilicon plug and said polysilicon sidewall spacer, forming a capacitor interelectrode dielectric layer on said bottom electrodes, and depositing and patterning a sixth polysilicon layer, and completing said stacked storage capacitors.

2. The method of claim 1, wherein said first insulating layer is silicon oxide having a thickness of between about 1000 to 2000 Angstroms.

3. The method of claim 1, wherein said second insulating layer is composed of silicon oxide and has a thickness of between about 1000 to 2000 Angstroms.

4. The method of claim 1, wherein said third insulating layer is composed of borophosphosilicate glass (BPSG) having a thickness of between about 5000 to 10000 Angstroms.

5. The method of claim 4, wherein said third insulating layer is made essentially planar by thermal anneal.

6. The method of claim 1, wherein said dopant in said third polysilicon layer is doped with phosphorus (P) having a concentration in said third polysilicon layer between about 5.0 E 19 to 1.0 E 21 atoms/cm$^3$.

7. The method of claim 1, wherein the thickness of said third polysilicon layer is between about 1000 to 2000 Angstroms.

8. The method of claim 1, wherein said partially exposed polysilicon plugs are between about 4000 to 8000 Angstroms in height above the third insulating surface after etching back said third insulating layer.

9. The method of claim 1, wherein the thickness of said fourth polysilicon layer is between about 300 to 1000 Angstroms.

10. The method of claim 1, wherein said fourth insulating layer is composed of silicon nitride and is between about 1000 to 3000 Angstroms thick.

11. The method of claim 1, wherein the thickness of said fifth polysilicon layer is between about 1000 to 2000 Angstroms.

12. The method of claim 1, wherein said patterned first polysilicon layer form the gate electrodes and word lines for field effect transistors (FETs), said patterned second polysilicon form the bit lines to said FETs, and said stacked storage capacitors contacting said FET node contacts form dynamic random access memory (DRAM) cells.

13. A method for fabricating dynamic random access memory cells having stacked storage capacitors on a semiconductor substrate, comprising the steps of:

providing a semiconductor substrate having device areas surrounded and electrically isolated from each other by field oxide areas, said device areas having field effect transistors formed, in part, from a patterned first polysilicon layer, and having source/drain contact areas in said devices areas, said substrate coated with a first insulating layer in which are etched bit line contact openings to select source/drain contact areas for bit line interconnections, said bit lines composed, in part, from a patterned second polysilicon layer, and further forming said stacked storage capacitors by;

depositing a second insulating layer on said substrate and over said patterned second polysilicon layer, depositing a third insulating layer on said second insulating layer, said third insulating layer being essentially planar, anisotropically etching node contact openings in said third, second and first insulating layers to said source/ drain contact areas required for the bottom electrodes of said stacked storage capacitors, depositing a conformal third polysilicon layer, and thereby filling said node contact openings, and forming a uniformly thick and planar third polysilicon layer elsewhere on said planar third insulating layer, etching back said third polysilicon layer to said third insulating layer, and thereby forming polysilicon plugs in said node contact openings, partially etching back said third insulating layer and thereby exposing upper portions of said polysilicon plugs, and said polysilicon plug having essentially vertical sidewalls, depositing a conformal fourth polysilicon layer on said upper portions of said polysilicon plugs, and elsewhere on said third insulating layer, depositing a conformal fourth insulating layer on said fourth polysilicon layer, and anisotropically blanket etching back said fourth insulating to said fourth polysilicon layer, and thereby forming insulating sidewall spacers on said polysilicon plugs from said fourth insulating layer, depositing a conformal fifth polysilicon layer on said polysilicon plugs, on said insulating sidewall spacers, and elsewhere on said fourth polysilicon layer, and anisotropically blanket etching back said fifth polysilicon layer, and further by said same etch back, etching back said fourth polysilicon layer elsewhere on the substrate, and thereby forming an array of fork-shaped bottom capacitor electrodes electrically isolated from each other, removing by selective isotropic etching said insulating sidewall spacers between said polysilicon plug and said polysilicon sidewall spacer, forming a capacitor interelectrode dielectric layer on said bottom electrodes, and depositing and patterning a sixth polysilicon layer, forming top capacitor electrodes and completing said stacked storage capacitors.

14. The method of claim 13, wherein said first insulating layer is silicon oxide having a thickness of between about 1000 to 2000 Angstroms.

15. The method of claim 13, wherein said second insulating layer is composed of silicon oxide and has a thickness of between about 1000 to 2000 Angstroms.

16. The method of claim 13, wherein said third insulating layer is composed of borophosphosilicate glass (BPSG) having a thickness of between about 5000 to 10000 Angstroms.

17. The method of claim 16, wherein said third insulating layer is made essentially planar by thermal anneal.

18. The method of claim 13, wherein said third polysilicon layer is doped with phosphorus (P) having a concentration in said third polysilicon layer between about $5.0\ E\ 19$ to $1.0\ E\ 21$ atoms/cm$^3$.

19. The method of claim 13, wherein the thickness of said third polysilicon layer is between about 1000 to 2000 Angstroms.

20. The method of claim 13, wherein said partially exposed portions of said polysilicon plugs are between about 4000 to 8000 Angstroms in height above the third insulating surface after etching back said third insulating layer.

21. The method of claim 13, wherein the thickness of said fourth polysilicon layer is between about 300 to 1000 Angstroms.

22. The method of claim 13, wherein said fourth insulating layer is composed of silicon oxide and is between about 1000 to 3000 Angstroms thick.

23. The method of claim 13, wherein the thickness of said fifth polysilicon layer is between about 1000 to 2000 Angstroms.

24. The method of claim 13, wherein said dynamic random access memory (DRAM) cells are formed concurrently with peripheral circuits on the DRAM chip to form a complete DRAM integrated circuit device.

25. A method for fabricating stacked storage capacitors on a semiconductor substrate, comprising the steps of:

providing a semiconductor substrate having device areas surrounded and electrically isolated from each other by field oxide areas, said device areas having semiconductor devices formed, in part, from a patterned first polysilicon layer, and having contact areas in said devices areas, said substrate coated with a first insulating layer in which are etched contact openings to select contact areas for electrical interconnections, said interconnections composed, in part, from a patterned second polysilicon layer, and further forming said stacked storage capacitors by;

depositing a second insulating layer on said substrate and over said patterned second polysilicon layer, depositing a third insulating layer on said second insulating layer, said third insulating layer being essentially planar, anisotropically etching node contact openings in said third, second and first insulating layers to said device contact areas required for bottom electrodes of said stacked storage capacitors, depositing a conformal third polysilicon layer, and thereby filling said node contact openings, and forming a uniformly thick and planar third polysilicon layer elsewhere on said planar third insulating layer, removing a portion of said third polysilicon layer to said third insulating layer, and thereby forming polysilicon plugs in said node contact openings, partially etching back said third insulating layer and thereby exposing upper portions of said polysilicon plugs, and said polysilicon plug having essentially vertical sidewalls, depositing a conformal fourth polysilicon layer on said upper portions of said polysilicon plugs, and elsewhere on said third insulating layer, depositing a conformal fourth insulating layer on said fourth polysilicon layer, and anisotropically blanket etching back said fourth insulating to said fourth polysilicon layer, and thereby forming insulating sidewall spacers on said polysilicon plugs from said fourth insulating layer, depositing a conformal fifth polysilicon layer on said polysilicon plugs, on said insulating sidewall spacers, and elsewhere on said fourth polysilicon layer, and anisotropically blanket etching back said fifth polysilicon layer, and further by said same etch back, etching back said fourth polysilicon layer elsewhere on the substrate, and thereby forming an array of fork-shaped bottom capacitor electrodes electrically isolated from each other, etching isotropically and selectively removing the insulating sidewall spacers between said polysilicon plug and said polysilicon sidewall spacer, and furthermore concurrently removing completely said third insulating layer, forming a capacitor interelectrode dielectric layer on said bottom electrodes, and depositing and patterning a sixth polysilicon layer, and completing said stacked storage capacitors.

26. The method of claim 25, wherein said first insulating layer is silicon oxide having a thickness of between about 1000 to 2000 Angstroms.

27. The method of claim 25, wherein said second insulating layer is composed of silicon nitride ($Si_3N_4$) and has a thickness of between about 1000 to 2000 Angstroms.

28. The method of claim 25, wherein said third insulating layer is composed of borophosphosilicate glass (BPSG) having a thickness of between about 5000 to 10000 Angstroms.

29. The method of claim 28, wherein said third insulating layer is made essentially planar by thermal anneal.

30. The method of claim 25, wherein said dopant in said third polysilicon layer is doped with phosphorus (P) having a concentration in said third polysilicon layer between about 5.0 E 19 to 1.0 E 21 atoms/$cm^3$.

31. The method of claim 25, wherein the thickness of said third polysilicon layer is between about 1000 to 2000 Angstroms.

32. The method of claim 25, wherein said partially exposed polysilicon plugs are between about 4000 to 8000 Angstroms in height above the third insulating surface after etching back said third insulating layer.

33. The method of claim 25, wherein the thickness of said fourth polysilicon layer is between about 300 to 1000 Angstroms.

34. The method of claim 25, wherein said fourth insulating layer is composed of silicon oxide and is between about 1000 to 3000 Angstroms thick.

35. The method of claim 25, wherein the thickness of said fifth polysilicon layer is between about 1000 to 2000 Angstroms.

* * * * *